(12) United States Patent
Lee (10) Patent No.: US 9,452,711 B2
(45) Date of Patent: Sep. 27, 2016

(54) APPARATUS AND METHOD FOR CONTROLLING OUTPUT OF HORN OF VEHICLE

(71) Applicant: HYUNDAI MOBIS CO., LTD., Seoul (KR)

(72) Inventor: Hyun Ji Lee, Yongin (KR)

(73) Assignee: HYUNDAI MOTOR CO., LTD., Seoul (KR)

( * ) Notice: Subject to any disclaimer, the term of this patent is extended or adjusted under 35 U.S.C. 154(b) by 21 days.

(21) Appl. No.: 14/721,951

(22) Filed: May 26, 2015

(65) Prior Publication Data

US 2016/0046235 A1    Feb. 18, 2016

(30) Foreign Application Priority Data

Aug. 18, 2014  (KR) .................. 10-2014-0106948

(51) Int. Cl.
| | |
|---|---|
| *H04R 27/00* | (2006.01) |
| *B60Q 5/00* | (2006.01) |
| *H04R 5/02* | (2006.01) |
| *H03G 3/30* | (2006.01) |

(52) U.S. Cl.
CPC .............. *B60Q 5/006* (2013.01); *H04R 5/02* (2013.01); *H03G 3/3005* (2013.01)

(58) Field of Classification Search
None
See application file for complete search history.

(56) References Cited

U.S. PATENT DOCUMENTS

| | | | | |
|---|---|---|---|---|
| 5,883,571 A | * | 3/1999 | Cotter | B60Q 1/445 180/172 |
| 6,271,746 B1 | * | 8/2001 | Lisiak | B60Q 5/00 340/425.5 |
| 2007/0257783 A1 | * | 11/2007 | Matsumoto | B60K 6/445 340/425.5 |

FOREIGN PATENT DOCUMENTS

KR    10-2013-0061530 A    6/2013

* cited by examiner

*Primary Examiner* — Muhammad N Edun (57) ABSTRACT

The present invention provides a horn sound output control apparatus of a vehicle, including: a vehicle speed comparing unit; an object determining unit which, when it is determined that the current speed of the principle vehicle is equal to or lower than the reference speed, determines that an object located within a predetermined distance from the principle vehicle is the other vehicle; a horn volume adjusting unit which, when it is determined that the object is the other vehicle, adjusts a horn volume of the principle vehicle to maintain a reference volume and when it is determined that the object is not the other vehicle, adjusts the horn volume of the principle vehicle to be equal to or lower than the reference volume; and a horn sound output unit which outputs a horn sound of the principle vehicle to the outside based on the adjusted horn volume.

15 Claims, 4 Drawing Sheets

APPARATUS AND METHOD FOR CONTROLLING OUTPUT OF HORN OF VEHICLE

CROSS-REFERENCE TO RELATED APPLICATIONS

This application claims priority to and the benefit of Korean Patent Application No. 10-2014-0106948 filed in the Korean Intellectual Property Office on Aug. 18, 2014, the entire contents of which are incorporated herein by reference.

TECHNICAL FIELD

The present invention relates to an apparatus and a method for controlling output of a horn sound of a vehicle, and more particularly, to an apparatus and a method for adjusting a volume of a horn of a vehicle to control output of a horn sound of the vehicle.

BACKGROUND ART

In the related art, when a horn of a vehicle is output to draw a pedestrian's attention, unintentional damage may be caused to the pedestrian due to a louder horn sound.

In order to solve the above-mentioned problem, the driver needs to quickly determine a kind of an object such as a pedestrian, a bicycle, or a vehicle and manually manipulate a button to adjust the horn sound, which may be inconvenient to the driver.

Korean Unexamined Patent Application Publication No. 2013-0061530 discloses a device which controls output of a horn sound of a vehicle. However, the device simply adjusts the volume of the horn of the vehicle in accordance with a position of the vehicle, regardless of an object which is located near the vehicle, so that the problem may not be solved by this device.

SUMMARY OF THE INVENTION

The present invention has been made in an effort to provide an apparatus and a method for controlling output of a horn sound of a vehicle which may automatically adjust a volume of a horn of a vehicle in accordance with a kind of an object which is located near the vehicle to control output of a horn sound of the vehicle.

However, an object of the present invention is not limited to the above description and other objects which have not been mentioned above will be more apparent to those skilled in the art from a reading of the following description.

An exemplary embodiment of the present invention provides a horn sound output control apparatus of a vehicle, comprising: a vehicle speed comparing unit which determines whether a current speed of a driver's vehicle (hereinafter, referred to as a principle vehicle) is equal to or lower than a reference speed; an object determining unit which, when it is determined that the current speed of the principle vehicle is equal to or lower than the reference speed, determines that an object located within a predetermined distance from the principle vehicle is the other vehicle; a horn volume adjusting unit which, when it is determined that the object is the other vehicle, adjusts a horn volume of the principle vehicle to maintain a reference volume and when it is determined that the object is not the other vehicle, adjusts the horn volume of the principle vehicle to be equal to or lower than the reference volume; and a horn sound output unit which outputs a horn sound of the principle vehicle to the outside based on the adjusted horn volume.

The apparatus may further include an object detecting unit which detects the object and when the object is detected, the vehicle speed comparing unit may determine whether a current speed of the principle vehicle is equal to or lower than the reference speed.

The apparatus may further include an image obtaining unit which obtains an image including the object and the object determining unit may determine whether the object is the other vehicle based on the image.

The object determining unit may determine whether the object is the other vehicle based on brightness of the outside and information obtained by analyzing the image.

The object determining unit may use at least one of a density of pixels which form a contour, a ratio of moving pixels with respect to the entire pixels, and the number of colors of the entire pixels as the information obtained by analyzing the image.

The object determining unit may determine whether the object is the other vehicle further using a relative speed of the object with respect to the principle vehicle.

The object determining unit may obtain a first calculation value by multiplying a brightness of the outside and a value obtained by dividing a ratio of shifted pixels with respect to the entire pixels obtained from the image by the density of the pixels which form the contour obtained from the image, obtain a second calculation value by multiplying a difference between 1 and the brightness of the outside and a difference between 1 and a color distribution value of the image, and determine whether the object is the other vehicle using a value obtained by adding the second calculation value to the first calculation value.

When it is determined that the object is not the other vehicle, the object determining unit may further determine whether the object is a fixed object which does not move and when it is determined that the object is not the fixed object, the horn volume adjusting unit may maintain the horn volume of the principle vehicle in the current state and when it is determined that the object is the fixed object, the horn volume adjusting unit may adjust the horn volume of the principle vehicle to be zero.

The apparatus may further include a threshold reaching determining unit which, when it is determined that the current speed of the principle vehicle exceeds the reference speed, determines whether the current speed of the principle vehicle is equal to or lower than a threshold speed and when it is determined that the current speed of the principle vehicle is equal to or lower than the threshold speed, the horn volume adjusting unit may adjust the horn volume of the principle vehicle to maintain the reference volume and when it is determined that the current speed of the principle vehicle exceeds the threshold speed, the horn volume adjusting unit may adjust the horn volume of the principle vehicle to exceed the reference volume.

Further, another exemplary embodiment of the present invention provides a horn sound output control method of a vehicle, including: determining whether a current speed of a driver's vehicle (hereinafter, referred to as a principle vehicle) is equal to or lower than a reference speed; determining, when it is determined that the current speed of the principle vehicle is equal to or lower than the reference speed, whether an object located within a predetermined distance from the principle vehicle is the other vehicle; adjusting, when it is determined that the object is the other vehicle, a horn volume of the principle vehicle to maintain a reference volume and when it is determined that the object is not the other vehicle, adjusts the horn volume of the principle vehicle to be equal to or lower than the reference volume; and outputting a horn sound of the principle vehicle to the outside based on the adjusted horn volume.

Before the determining of whether a current speed of the principle vehicle is equal to or lower than a reference speed, the method may further include detecting the object, and when the object is detected, in the determining of whether a current speed of the principle vehicle is equal to or lower than a reference speed, it is determined whether the current speed of the principle vehicle is equal to or lower than the reference speed.

Between the determining of whether a current speed of the principle vehicle is equal to or lower than a reference speed and the determining of whether the object is the other vehicle, the method may further include obtaining an image including the object and in the determining of whether the object is the other vehicle, it is determined whether the object is the other vehicle based on the image.

In the determining of whether the object is the other vehicle, it is determined whether the object is the other vehicle based on brightness of the outside and information obtained by analyzing the image.

In the determining of whether the object is the other vehicle, at least one of a density of pixels which form a contour, a ratio of moving pixels with respect to the entire pixels, and the number of colors of the entire pixels as the information obtained by analyzing the image may be used.

In the determining of whether the object is the other vehicle, it is determined whether the object is the other vehicle further using a relative speed of the object with respect to the principle vehicle.

The determining of whether the object is the other vehicle may obtain a first calculation value by multiplying a brightness of the outside and a value obtained by dividing a ratio of shifted pixels with respect to the entire pixels obtained from the image by the density of the pixels which form the contour obtained from the image, obtain a second calculation value by multiplying a difference between 1 and the brightness of the outside and a difference between 1 and a color distribution value of the image, and determine whether the object is the other vehicle using a value obtained by adding the second calculation value to the first calculation value.

In the determining of whether the object is the other vehicle, when it is determined that the object is not the other vehicle, it is determined whether the object is a fixed object which does not move and in the adjusting, when it is determined that the object is not the fixed object, the horn volume of the principle vehicle is maintained in a current state and when it is determined that the object is the fixed object, the horn volume of the principle vehicle is adjusted to be 0.

Before the adjusting, the method may further include determining, when it is determined that the current speed of the principle vehicle exceeds the reference speed, whether the current speed of the principle vehicle is equal to or lower than a threshold speed and when it is determined that the current speed of the principle vehicle is equal to or lower than the threshold speed, in the adjusting, the horn volume of the principle vehicle is adjusted to maintain the reference volume and when it is determined that the current speed of the principle vehicle exceeds the threshold speed, the horn volume adjusting unit adjusts the horn volume of the principle vehicle to exceed the reference volume.

The present invention may have the following effects by automatically adjusting a volume of a horn of a vehicle in accordance with an object which is located near the vehicle to control a horn sound output of the vehicle.

First, it is possible to prevent a pedestrian or a bicycle rider from being injured due to a noise.

Second, a volume of the horn is appropriately adjusted even in a situation where the horn is hardly heard, such as a highway, so that a driver of another vehicle may recognize the vehicle.

Third, inconvenience in that the driver manually adjusts the horn sound may be removed.

DETAILED DESCRIPTION OF THE INVENTION

Hereinafter, exemplary embodiments of the present invention will be described in detail with reference to the accompanying drawings. In the figures, even though the parts are illustrated in different drawings, it should be understood that like reference numbers refer to the same or equivalent parts of the present invention throughout the several figures of the drawing. Furthermore, when it is judged that specific description on known configurations or functions related in the description of the present invention may unnecessarily obscure the essentials of the present invention, the detailed description will be omitted. Further, hereinafter, exemplary embodiments of the present invention will be described. However, it should be understood that the technical spirit of the invention is not limited to the specific embodiments, but may be changed or modified in various ways by those skilled in the art.

In the related art, a driver determines whether an approaching object is a pedestrian (or a bicycle rider) or a vehicle by him/herself to change a horn sound by pressing different buttons. However, in this case, the driver needs to be fully aware of functions of various buttons but cannot minutely adjust a volume of the horn sound.

According to the exemplary embodiment of the present invention, a kind of approaching object is automatically figured out by a front camera, a rear camera, and an object detecting sensor which are provided at the outside of the vehicle so that a damage due to the noise is reduced and a warning function is strengthened in a situation where no horn sound is heard.

Figure 1:
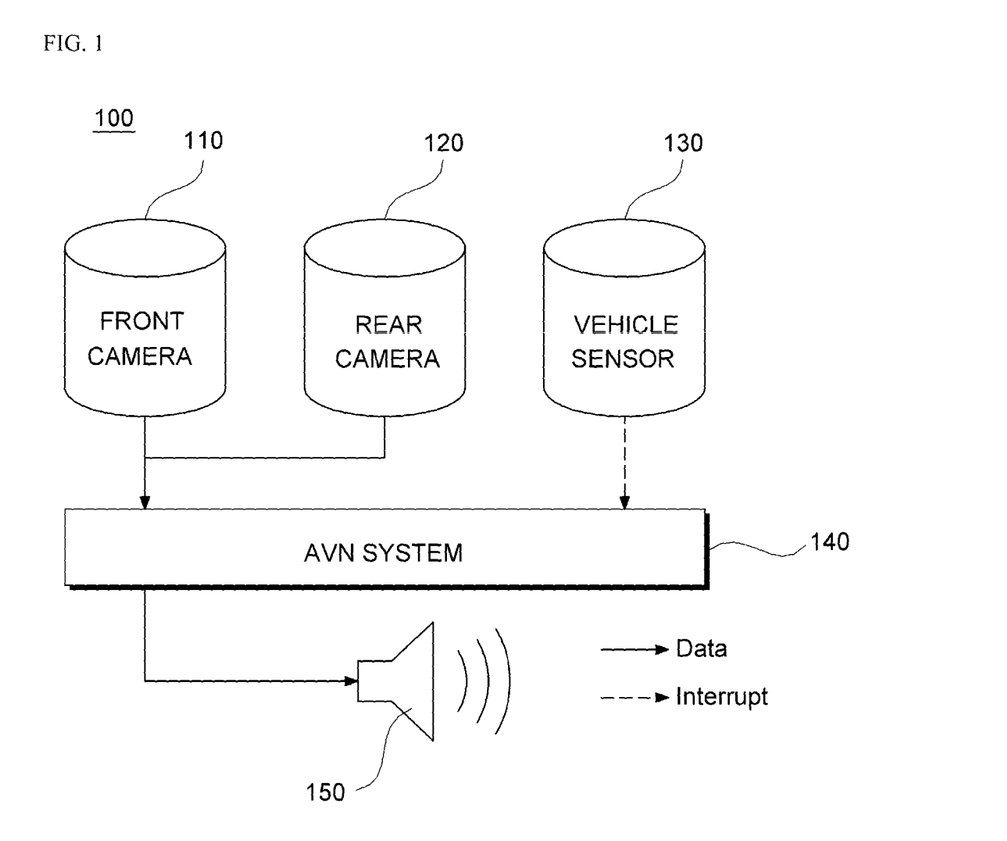
FIG. 1 is a conceptual view schematically illustrating a dynamic horn volume adjusting apparatus according to an exemplary embodiment of the present invention.

FIG. 1 is a conceptual view schematically illustrating a dynamic horn volume adjusting apparatus according to an exemplary embodiment of the present invention.

The dynamic horn volume adjusting apparatus 100 is an apparatus which dynamically adjusts a horn volume of a vehicle and includes a front camera 110, a rear camera 120, a vehicle sensor 130, an AVN system 140, and a speaker 150.

The front camera 110 photographs a front side of the vehicle to obtain a front image of the vehicle.

The rear camera 120 photographs a rear side of the vehicle to obtain a rear image of the vehicle.

The vehicle sensor 130 obtains various vehicle information which is generated when a vehicle is driven, such as a speed of the vehicle. In the exemplary embodiment of the present invention, the vehicle sensor 130 may be configured by sensors which contribute to a parking assistant system (PAS).

The AVN (audio video navigation) system 140 processes the images obtained by the front camera 110 and the rear camera 120. Further, the AVN system 140 controls a volume of a horn sound based on the result obtained by processing the image.

The speaker 150 outputs a predetermined volume of horn sound in accordance with the control of the AVN system 140.

Figure 2:
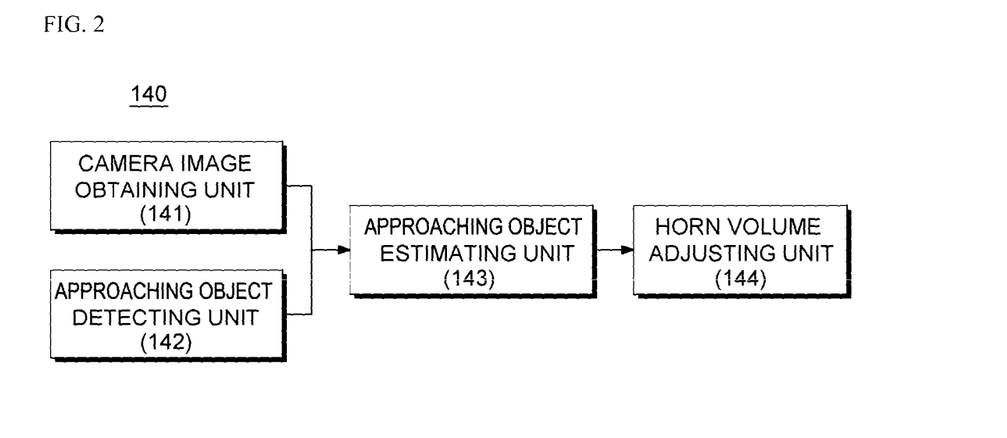
FIG. 2 is a conceptual view illustrating an internal configuration of an AVN system which configures a dynamic horn volume adjusting apparatus according to an exemplary embodiment of the present invention.

FIG. 2 is a conceptual view illustrating an internal configuration of an AVN system which configures a dynamic horn volume adjusting apparatus according to an exemplary embodiment of the present invention.

As illustrated in FIG. 2, the AVN system 140 includes a camera image obtaining unit 140, an approaching object detecting unit 142, an approaching object estimating unit 143, and a horn volume adjusting unit 144.

The camera image obtaining unit 141 controls the front camera 110 and the rear camera 120 to obtain the front image and the rear image of the vehicle.

The approaching object detecting unit 142 controls the vehicle sensor 130 to obtain various vehicle information.

The horn volume adjusting unit 144 dynamically adjusts the horn volume in accordance with a result which is determined by the approaching object estimating unit 143, that is, the kind of the approaching object.

When an object approaches the vehicle to be detected by the vehicle sensor 130, the approaching object estimating unit 143 determines a kind of the object using a camera image obtained by the front camera 110 and the rear camera 120 as if the driver determines the situation. In the exemplary embodiment of the present invention, the approaching object estimating unit 143 may determine the kind of approaching object as a vehicle, a bicycle rider, or a pedestrian.

The approaching object estimating unit 143 determines the kind of approaching object using the following equation. The approaching object estimating unit 143 determines the kind of approaching object basically using a low resolution image as an input image, but the present invention is not limited thereto.

$$F = (\alpha \times (\text{value of factor 1/value of factor 2})) + ((1-\alpha) \times (1 - \text{value of factor 3}))$$

In the Equation, a value of a factor 1 is an optical flow value and the unit thereof is w (window). In the exemplary embodiment of the present invention, the window has a value of 5 by 5 (unit pixel) so that the calculation may be rapidly performed. Further, a value of a factor 2 is an edge detection value and the unit is w. Further, a value of a factor 3 is a color distribution value and the unit is w.

First, the value of the factor 1, that is, the optical flow value will be described.

The approaching object estimating unit 143 figures out a moving speed of the object to figure out a kind of the object. The approaching object estimating unit 143 calculates a speed of a moving object or a ratio of moving pixel in the image based on a speed of a vehicle which is currently driven by the driver, and generates the calculated value as a size of the moving object. In this case, the value generated by the approaching object estimating unit 143 is the optical flow value.

Generally, the optical flow value is larger than 0 and smaller than 1 (0<ratio<1) and when the speed of the vehicle is equal to or higher than 60 km/h, the optical flow value is 1.

Since the optical flow value is proportional to a size and a speed of an object, the optical flow value is increased in the order of a pedestrian, a bicycle rider, and a vehicle.

Next, the value of the factor 2, that is, the edge detection value will be described.

The approaching object estimating unit 143 measures a density of a contour in the image. When the density of the contour is low, the approaching object estimating unit 143 distinguishes the kind of approaching object that the object is a big and simple object. In this case, the approaching object estimating unit 143 subtracts a density of an image immediately before detecting the object using the vehicle sensor 130 so that the result value of the approaching is not affected by a complexity of a background. The edge detection value has a value which is larger than 0 and smaller than 1 (0<distribution<1). When a shape of the object is simple, the edge detection value is small and when a shape of the object is complex, the edge detection value is large. Therefore, the edge detection value is increased in the order of a vehicle, a pedestrian, and a bicycle rider.

Next, the value of the factor 3, that is, the color distribution value will be described.

The approaching object estimating unit 143 represents a diversity of colors represented in the image by a histogram distribution degree to determine an object. When the diversity of colors is represented by a histogram, the approaching object estimating unit 143 checks how many histograms exceed 20% of the number of pixels of the image to be considered as a result.

The color distribution value is larger than 0 and smaller than 1 (0<color distribution<1) and the approaching object estimating unit 143 distinguishes an approaching object based on colors of clothes, a basic skin color, and a hair color. In this case, most various colors indicate a pedestrian, and a color distribution degree is lowered in the order of a pedestrian, a bicycle, and a vehicle.

Next, a correlation of the value of the factor 1, the value of the factor 2, and the value of the factor 3 will be described.

In the exemplary embodiment of the present invention, based on deduction that as a speed of the approaching object is high, the object is highly likely to be a vehicle, the algorithm is configured as follows: results of the factor 1 and the factor 2 are arranged such that a result of an entire algorithm function F is increased as a speed of an object is increased and the object is simple. When the value of the factor 3 is decreased, that is, it is determined that the color is simple and the object is close to the vehicle, the result of the function F is increased.

In the meantime, a value of a depends on a brightness of an external environment.

In the day time, in order to improve precision of the entire algorithm by a result of the distribution of colors, the value of a is set to be $0.5<\alpha<0.7$. The value of a may be adjusted in accordance with resolutions of images of the front and rear cameras.

At night, the value of $\alpha$ is set to be $0.7<\alpha<0.9$ to minimize influence of the color distribution.

Based on the above description, when the F value is smaller than a first reference value (for example, 0.7), the approaching object estimating unit 143 determines the approaching object as a pedestrian. When the F value is equal to or larger than the first reference value (for example, 0.7) and smaller than a second reference value (for example, 3), the approaching object estimating unit 143 determines the approaching object as a bicycle rider. When the F value is larger than the second reference value (for example, 3), the approaching object estimating unit 143 determines the approaching object as a vehicle.

Figure 3:
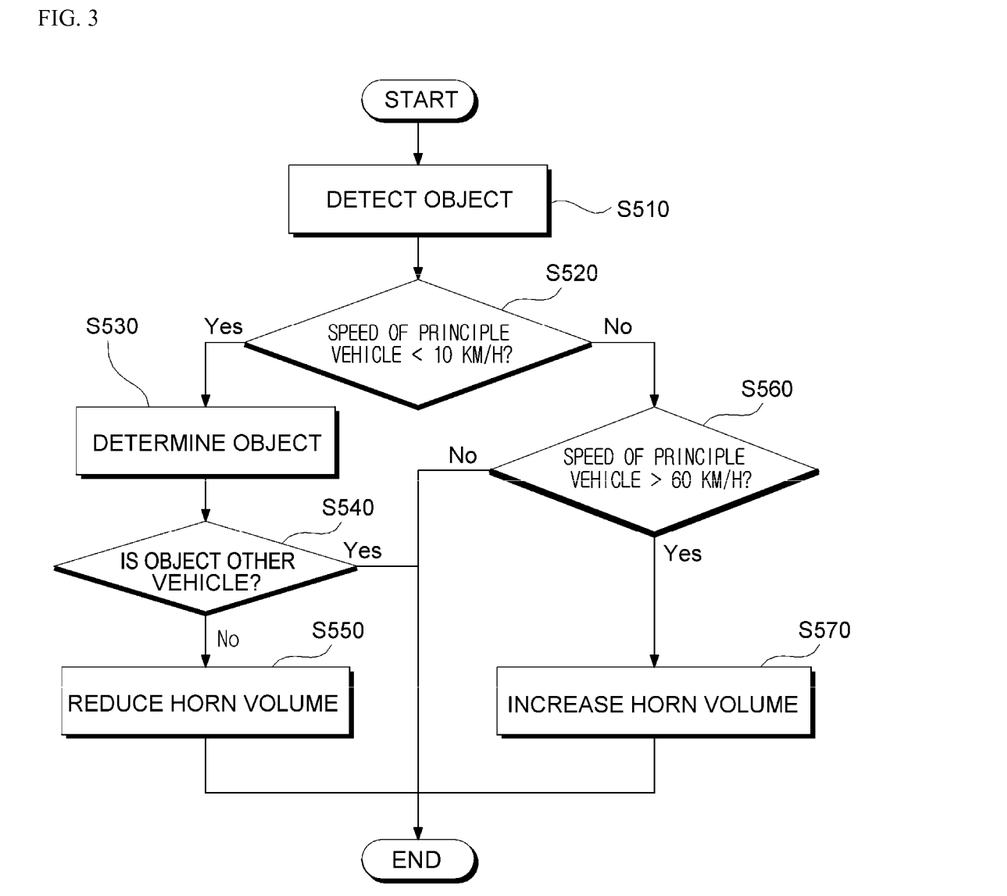
FIG. 3 is a flow chart of an exemplary embodiment illustrating an operating method of a dynamic horn volume adjusting apparatus according to an exemplary embodiment of the present invention.

Next, an operating method of a dynamic horn volume adjusting apparatus 100 will be described. FIG. 3 is a flow chart of an exemplary embodiment illustrating an operating method of a dynamic horn volume adjusting apparatus according to an exemplary embodiment of the present invention.

First, the camera image obtaining unit 141 detects objects from images obtained by the front camera 110 and the rear camera 120 in step S510.

Next, the approaching object detecting unit 142 measures a current speed of a driver's vehicle (hereinafter, referred to as a principle vehicle) using the vehicle sensor 130.

Next, the approaching object estimating unit 143 compares a current speed of the principle vehicle with a first reference speed (for example, 10 km/h). When the current speed of the principle vehicle is lower than the first reference speed in step S520, the approaching object estimating unit 143 determines a kind of an object in step S530. A method of determining a kind of object has been described above, so that detailed description thereof will be omitted.

When the object is determined as the other vehicle in step S540, the horn volume adjusting unit 144 maintains a horn volume to be a reference volume. In contrast, when it is not determined that the object is the other vehicle in step S540, the horn volume adjusting unit 144 reduces the horn volume to be smaller than the reference volume in step S550.

In the meantime, when it is determined that the current speed of the principle vehicle is higher than the first reference speed in step S520, the control unit determines whether the current speed of the principle vehicle exceeds a second reference speed (for example, 60 km/h) in step S560.

When it is determined that the current speed of the principle vehicle does not exceed the second reference speed in step S560, the horn volume adjusting unit 144 maintains the horn volume to be a reference volume. In contrast, when it is determined that the current speed of the principle vehicle exceeds the second reference speed in step S560, the horn volume adjusting unit 144 increases the horn volume to be higher than a reference volume in step S570.

The exemplary embodiment of the present invention has been described above with reference to FIGS. 1 to 3. Hereinafter, the exemplary embodiment of the present invention which may be deducted/perceived from the exemplary embodiment will be described below.

Figure 4:
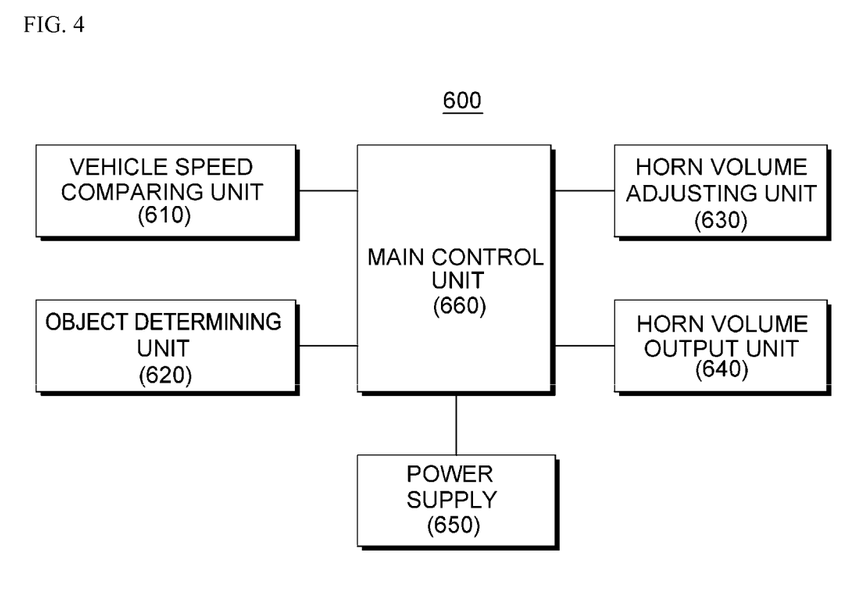
FIG. 4 is a block diagram schematically illustrating a vehicle horn sound output control apparatus according to an exemplary embodiment of the present invention.

FIG. 4 is a block diagram schematically illustrating a horn sound output control apparatus of a vehicle according to an exemplary embodiment of the present invention.

As illustrated in FIG. 4, the vehicle horn sound output control apparatus 600 includes a vehicle speed comparing unit 610, an object determining unit 620, a horn volume adjusting unit 630, a horn sound output unit 640, a power supply 650, and a main control unit 660.

The power supply 650 supplies power to individual components of the vehicle horn sound output control apparatus 600. The main control unit 660 controls the overall operation of individual components of the vehicle horn sound output control apparatus 600. When considering that the vehicle horn sound output control apparatus 600 is provided in an automobile AVN system, the power supply 650 and the main control unit 660 may not be provided in the exemplary embodiment.

The vehicle speed comparing unit 610 determines whether the current speed of the principle vehicle is equal to or lower than a reference speed.

When the vehicle speed comparing unit 610 determines that the current speed of the principle vehicle is equal to or lower than a reference speed, the object determining unit 620 determines a kind of an object which is located within a predetermined distance from the principle vehicle. Specifically, when the vehicle speed comparing unit 610 determines that the current speed of the principle vehicle is equal to or lower than the reference speed, the object determining unit 620 determines that the object which is located within a predetermined distance from the principle vehicle is the other vehicle.

When the object determining unit 620 determines that the object is the other vehicle, the horn volume adjusting unit 630 adjusts a horn volume of the principle vehicle to maintain the reference volume.

Further, when it is determined that the object is not the other vehicle, the horn volume adjusting unit 630 adjusts the horn volume of the principle vehicle to be lower than the reference volume. When the horn volume of the principle vehicle is adjusted to be lower than the reference volume, the horn volume adjusting unit 630 adjusts the horn volume of the principle vehicle to be larger than 0 and smaller than the reference volume.

The horn volume output unit 640 outputs the horn sound of the principle vehicle to the outside based on the horn volume adjusted by the horn volume adjusting unit 630.

Figure 5:
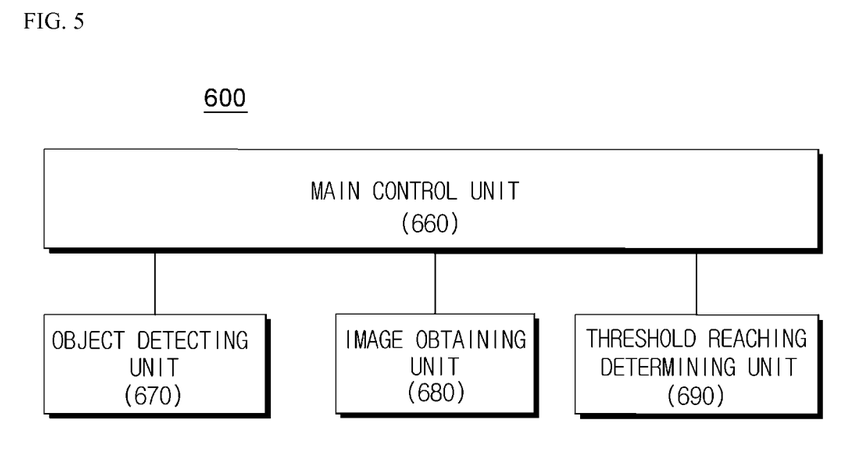
FIG. 5 is a block diagram illustrating an internal configuration which is added to the vehicle horn sound output control apparatus of FIG. 4.

The vehicle horn sound output control apparatus 600 may further include at least one of an object detecting unit 670 and an image obtaining unit 680 as illustrated in FIG. 5. FIG. 5 is a block diagram illustrating an internal configuration which is added to the vehicle horn sound output control apparatus of FIG. 4.

The object detecting unit 670 detects an object.

When the object detecting unit 670 detects an object, the vehicle speed comparing unit 610 may determine whether the current speed of the principle vehicle is equal to or lower than the reference speed.

In the exemplary embodiment, the object detecting unit 670 detects an object when the object is located within a reference distance. In the exemplary embodiment, the object detecting unit 670 may be implemented by an ultrasonic sensor.

The image obtaining unit 680 obtains an image including an object.

The object determining unit 620 determines whether the object is the other vehicle based on the image obtained by the image obtaining unit 680.

The object determining unit 620 may determine whether the object is the other vehicle based on a brightness of the outside of the vehicle and information obtained by analyzing the image obtained by the image obtaining unit 680. In the above description, the brightness of the outside of the vehicle is a concept corresponding to α in the above-described equation.

The object determining unit 620 may use at least one of a density of pixels which form a contour, a ratio of shifted pixels with respect to the entire pixels, and the number of colors of the entire pixels as the information obtained by analyzing the image. In the above description, the density of the pixels which form the contour is a concept corresponding to the edge detection value in the above-described equation. Further, the ratio of shifted pixels with respect to the entire pixels is a concept corresponding to the optical flow value in the above-described equation, specifically, a ratio of moving pixels. Further, the number of colors of the entire pixels is a concept corresponding to the color distribution value in the above-described equation.

In the meantime, the object determining unit 620 may determine whether the object is the other vehicle further using a relative speed of the object with respect to the principle vehicle. In the above description, the relative speed of the object with respect to the principle vehicle is a concept corresponding to the optical flow value, specifically, a speed of the moving object in the image.

In the meantime, when considering the above equation, the object determining unit 620 obtains a first calculation value by multiplying the brightness of the outside and a value obtained by dividing a ratio of shifted pixels with respect to the entire pixels obtained from the image by the density of the pixels which form the contour obtained from the image, obtain a second calculation value by multiplying a difference between 1 and the brightness of the outside and a difference between 1 and a color distribution value of the image, and determines whether the object is the other vehicle using a value obtained by adding the second calculation value to the first calculation value.

In the meantime, when it is determined that the object is not the other vehicle, the object determining unit 620 further determines whether the object is a fixed object which does not move.

In this case, when it is determined that the object is not the fixed object, the horn volume adjusting unit 630 maintains the horn volume of the principle vehicle in the current state and when it is determined that the object is the fixed object, the horn volume adjusting unit 630 adjusts the horn volume of the principle vehicle to be zero. In the meantime, the vehicle horn sound output control apparatus 600 may further include a threshold reaching determining unit 690, as illustrated in FIG. 5.

When it is determined that the current speed of the principle vehicle exceeds the reference speed, the threshold reaching determining unit 690 determines whether the current speed of the principle vehicle is equal to or lower than a threshold speed.

In this case, when it is determined that the current speed of the principle vehicle is equal to or lower than the threshold speed, the horn volume adjusting unit 630 adjusts the horn volume of the principle vehicle to maintain the reference volume. When it is determined that the current speed of the principle vehicle exceeds the threshold speed, the horn volume adjusting unit 630 adjusts the horn volume of the principle vehicle to exceed the reference volume.

In the exemplary embodiment, when it is determined that the current speed of the principle vehicle exceeds the reference speed, the horn volume adjusting unit 630 may adjust the horn volume of the principle vehicle to be equal to or higher than the reference volume.

Figure 6:
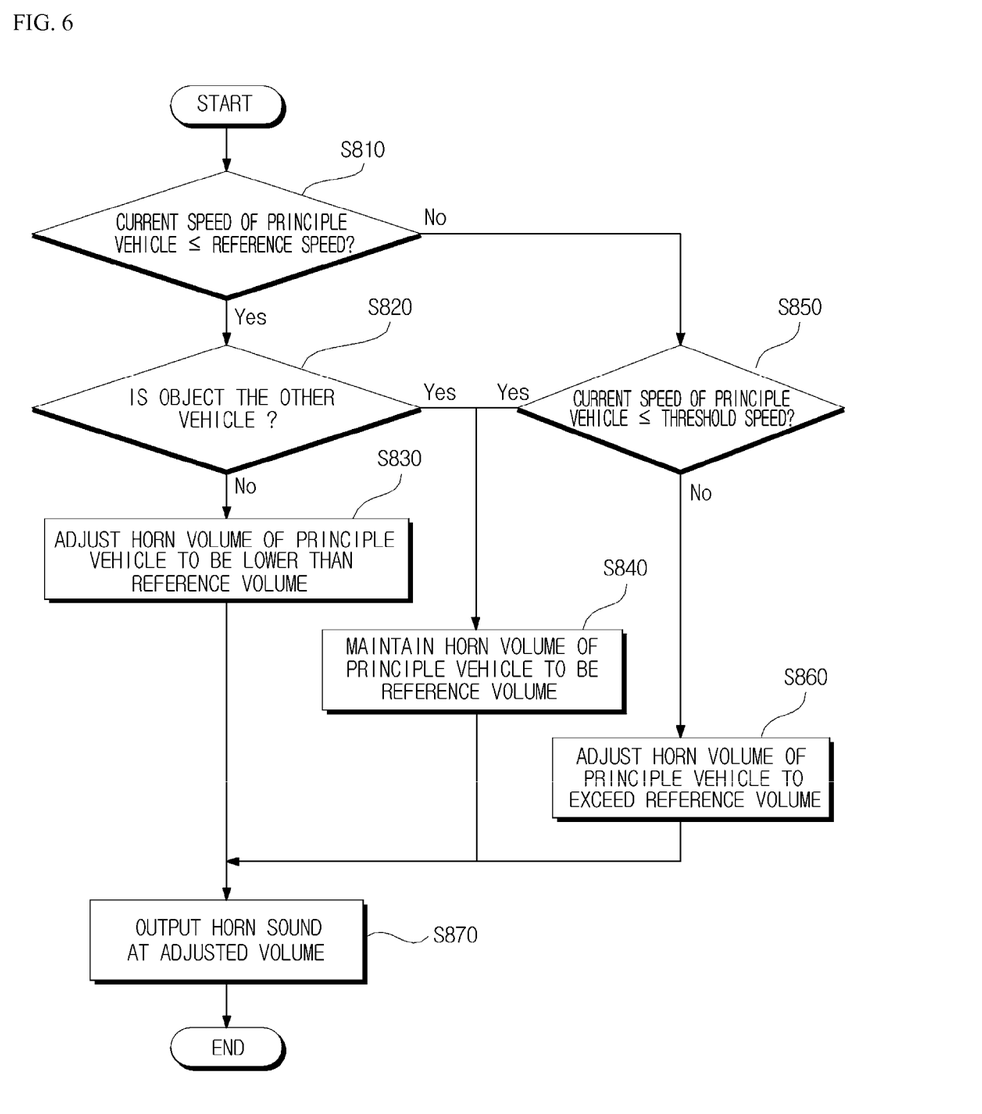
FIG. 6 is a flow chart schematically illustrating a vehicle horn sound output control method according to an exemplary embodiment of the present invention.

Next, an operating method of the vehicle hone sound output control apparatus 600 will be described. FIG. 6 is a flow chart schematically illustrating a vehicle horn sound output control method according to an exemplary embodiment of the present invention.

First, the vehicle speed comparing unit 610 determines whether a current speed of a principle vehicle is equal to or lower than a reference speed in step S810.

When it is determined that the current speed of the principle vehicle is equal to or lower than the reference speed in step S810, the object determining unit 620 determines whether an object which is located within a predetermined distance from the principle vehicle is the other vehicle in step S820.

When the object is determined to be the other vehicle in step S820, the horn volume adjusting unit 630 adjusts the horn sound of the principle vehicle to maintain a reference volume in step S840. In contrast, when it is determined that the object is not the other vehicle in step S820, the horn volume adjusting unit 630 adjusts the horn sound of the principle vehicle to be lower than the reference volume in step S830.

In the meantime, when it is determined that the current speed of the principle vehicle exceeds the reference speed in step S810, the threshold reaching determining unit 690 determines whether the current speed of the principle vehicle is equal to or lower than a threshold speed in step S850.

When it is determined that the current speed of the principle vehicle is equal to or lower than a threshold speed in step S850, the horn volume adjusting unit 630 adjusts the horn sound of the principle vehicle to maintain a reference volume in step S840. In contrast, when it is determined that the current speed of the principle vehicle exceeds a threshold speed in step S850, the horn volume adjusting unit 630 adjusts the horn sound of the principle vehicle to exceed the reference volume in step S860.

Next, the horn sound output unit 640 outputs the horn sound of the principle vehicle to the outside based on the adjusted horn volume in step S870.

In the meantime, in the exemplary embodiment, when it is determined that the current speed of the principle vehicle exceeds the reference speed in step S810, the sound volume adjusting unit 630 may adjust the horn volume of the principle vehicle to maintain the reference volume regardless of whether the current speed of the principle vehicle is equal to or lower than the threshold speed.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardwares. Further, such a computer program may be stored in a computer readable media such as a USB memory, a CD disk, or a flash memory to be read and executed by a computer to implement the exemplary embodiment of the present invention. The recording media of the computer program may include a magnetic recording medium, an optical recording medium, or a carrier wave medium.

If it is not contrarily defined in the detained description, all terms used herein including technological or scientific terms have the same meaning as those generally understood by a person with ordinary skill in the art. A generally used terminology which is defined in a dictionary may be interpreted to be equal to a contextual meaning of the related technology but is not interpreted to have an ideal or excessively formal meaning, if it is not apparently defined in the present invention.

The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit is not limited by the exemplary embodiments and accompanying drawings. The protection scope of the present invention should be interpreted based on the following appended claims and it should be appreciated that all technical spirits included within a range equivalent thereto are included in the scope of the present invention.

What is claimed is:

1. A horn sound output control apparatus of a vehicle, comprising:
   a vehicle speed comparing unit which determines whether a current speed of a driver's vehicle (hereinafter, referred to as a principle vehicle) is equal to or lower than a reference speed;
   an object determining unit which, when it is determined that the current speed of the principle vehicle is equal to or lower than the reference speed, determines that an object located within a predetermined distance from the principle vehicle is the other vehicle;
   a horn volume adjusting unit which, when it is determined that the object is the other vehicle, adjusts a horn volume of the principle vehicle to maintain a reference volume and when it is determined that the object is not the other vehicle, adjusts the horn volume of the principle vehicle to be equal to or lower than the reference volume; and
   a horn sound output unit which outputs a horn sound of the principle vehicle to the outside based on the adjusted horn volume.

2. The apparatus of claim 1, further comprising:
   an object detecting unit which detects the object,
   wherein when the object is detected, the vehicle speed comparing unit determines whether a current speed of the principle vehicle is equal to or lower than the reference speed.

3. The apparatus of claim 1, further comprising:
   an image obtaining unit which obtains an image including the object,
   wherein the object determining unit determines whether the object is the other vehicle based on the image.

4. The apparatus of claim 3, wherein the object determining unit determines whether the object is the other vehicle based on brightness of the outside and information obtained by analyzing the image.

5. The apparatus of claim 4, wherein the object determining unit uses at least one of a density of pixels which form a contour, a ratio of shifted pixels with respect to the entire pixels and the number of colors of the entire pixels as the information obtained by analyzing the image.

6. The apparatus of claim 4, wherein the object determining unit determines whether the object is the other vehicle further using a relative speed of the object with respect to the principle vehicle.

7. The apparatus of claim 4, wherein the object determining unit obtains a first calculation value by multiplying a brightness of the outside and a value obtained by dividing a ratio of shifted pixels with respect to the entire pixels obtained from the image by the density of the pixels which form the contour obtained from the image, obtain a second calculation value by multiplying a difference between 1 and the brightness of the outside and a difference between 1 and a color distribution value of the image, and determines whether the object is the other vehicle using a value obtained by adding the second calculation value to the first calculation value.

8. The apparatus of claim 1, wherein when it is determined that the object is not the other vehicle, the object determining unit further determines whether the object is a fixed object which does not move and
   when it is determined that the object is not the fixed object, the horn volume adjusting unit maintains the horn volume of the principle vehicle in the current state and when it is determined that the object is the fixed object, the horn volume adjusting unit 630 adjusts the horn volume of the principle vehicle to be zero.

9. The apparatus of claim 1, further comprising:
   a threshold reaching determining unit which, when it is determined that the current speed of the principle vehicle exceeds the reference speed, determines whether the current speed of the principle vehicle is equal to or lower than a threshold speed,
   wherein when it is determined that the current speed of the principle vehicle is equal to or lower than the threshold speed, the horn volume adjusting unit adjusts the horn volume of the principle vehicle to maintain the reference volume and when it is determined that the current speed of the principle vehicle exceeds the threshold speed, the horn volume adjusting unit adjusts the horn volume of the principle vehicle to exceed the reference volume.

10. A horn sound output control method of a vehicle, comprising:
    determining whether a current speed of a driver's vehicle (hereinafter, referred to as a principle vehicle) is equal to or lower than a reference speed;
    determining, when it is determined that the current speed of the principle vehicle is equal to or lower than the reference speed, whether an object located within a predetermined distance from the principle vehicle is the other vehicle;
    adjusting, when it is determined that the object is the other vehicle, a horn volume of the principle vehicle to maintain a reference volume and when it is determined that the object is not the other vehicle, adjusts the horn volume of the principle vehicle to be equal to or lower than the reference volume; and
    outputting a horn sound of the principle vehicle to the outside based on the adjusted horn volume.

11. The method of claim 10, further comprising:
    obtaining an image including the object,
    wherein in the determining of whether the object is the other vehicle, it is determined whether the object is the other vehicle based on the image.

12. The method of claim 11, wherein in the determining of whether the object is the other vehicle, it is determined whether the object is the other vehicle based on brightness of the outside and information obtained by analyzing the image.

13. The method of claim 12, wherein in the determining of whether the object is the other vehicle, at least one of a density of pixels which form a contour, a ratio of shifted pixels with respect to the entire pixels, and the number of colors of the entire pixels as the information obtained by analyzing the image is used.

14. The method of claim 12, wherein in the determining of whether the object is the other vehicle, when it is determined whether the object is the other vehicle, a relative speed of the object with respect to the principle vehicle is further used.

15. The method of claim 10, further comprising:
determining, when it is determined that the current speed of the principle vehicle exceeds the reference speed, whether the current speed of the principle vehicle is equal to or lower than a threshold speed,
wherein when it is determined that the current speed of the principle vehicle is equal to or lower than the threshold speed, in the adjusting, the horn volume of the principle vehicle is adjusted to maintain the reference volume and when it is determined that the current speed of the principle vehicle exceeds the threshold speed, the horn volume adjusting unit adjusts the horn volume of the principle vehicle to exceed the reference volume.

* * * * *